United States Patent
Fan et al.

(10) Patent No.: US 11,011,586 B2
(45) Date of Patent: May 18, 2021

(54) DISPLAY SUBSTRATE AND A DISPLAY APPARATUS

(71) Applicant: BOE TECHNOLOGY GROUP CO., LTD., Beijing (CN)

(72) Inventors: Xing Fan, Beijing (CN); Guang Yan, Beijing (CN); Lintao Zhang, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 480 days.

(21) Appl. No.: 15/761,372

(22) PCT Filed: Jul. 20, 2017

(86) PCT No.: PCT/CN2017/093689
§ 371 (c)(1),
(2) Date: Mar. 19, 2018

(87) PCT Pub. No.: WO2018/188227
PCT Pub. Date: Oct. 18, 2018

(65) Prior Publication Data
US 2020/0251535 A1 Aug. 6, 2020

(30) Foreign Application Priority Data
Apr. 11, 2017 (CN) .......................... 201710233157.2

(51) Int. Cl.
*H01L 27/32* (2006.01)
*H01L 51/50* (2006.01)
*H01L 51/52* (2006.01)

(52) U.S. Cl.
CPC ...... *H01L 27/3218* (2013.01); *H01L 27/3244* (2013.01); *H01L 51/5056* (2013.01);
(Continued)

(58) Field of Classification Search
CPC ............. H01L 27/3218; H01L 27/3244; H01L 51/5056; H01L 51/5072; H01L 51/5092;
(Continued)

(56) References Cited

U.S. PATENT DOCUMENTS 7,816,677 B2 * 10/2010 Lee ...................... H01L 51/5215
257/40
9,153,796 B2 * 10/2015 Sato ...................... H01L 51/5036
(Continued)

FOREIGN PATENT DOCUMENTS

CN     101013745 A    8/2007
CN     105097842 A    11/2015
(Continued)

OTHER PUBLICATIONS

First Office Action in the Chinese Patent Application No. 201710233157.2, dated Mar. 19, 2020; English translation attached.
(Continued)

*Primary Examiner* — Dale E Page
*Assistant Examiner* — Quovaunda Jefferson
(74) *Attorney, Agent, or Firm* — Intellectual Valley Law, P.C.

(57) ABSTRACT

The present application discloses a display substrate including a plurality of pixels arranged in an array of matrix. Each of the plurality of pixels includes several OLED devices emitting light of different color. Each OLED device includes at least a first electrode, a second electrode, and an emitting layer located between the first electrode and the second electrode. At least one layer in either part of the first electrode or the emitting layer forming a microcavity characterized by an optical length. Any two OLED devices emitting light of same color in two adjacent pixels of the plurality of pixels have two microcavities respectively with different optical lengths. At least one OLED device emitting
(Continued)

any one colored light in any one pixel of the plurality of pixels has a microcavity with different optical length from other OLED devices emitting light of different color in the same one pixel.

18 Claims, 5 Drawing Sheets

(52) U.S. Cl.
CPC ...... *H01L 51/5072* (2013.01); *H01L 51/5092* (2013.01); *H01L 51/5218* (2013.01); *H01L 51/5234* (2013.01); *H01L 2251/305* (2013.01); *H01L 2251/558* (2013.01)

(58) Field of Classification Search
CPC ............. H01L 51/5218; H01L 51/5234; H01L 2251/305; H01L 2251/558
See application file for complete search history.

(56) References Cited

U.S. PATENT DOCUMENTS

| | | | |
|---|---|---|---|
| 2008/0143649 | A1 | 6/2008 | Asaki et al. |
| 2009/0212692 | A1 | 8/2009 | Hasegawa |
| 2014/0061597 | A1 | 3/2014 | Choi et al. |
| 2016/0111674 | A1 | 4/2016 | Bae et al. |
| 2016/0133840 | A1 | 5/2016 | Song et al. |
| 2016/0240591 | A1 | 8/2016 | Song et al. |
| 2017/0125496 | A1* | 5/2017 | Oh ..................... H01L 27/3211 |
| 2017/0221762 | A1 | 8/2017 | Cai et al. |
| 2017/0352304 | A1* | 12/2017 | Funatsu ............... G09G 3/2003 |

FOREIGN PATENT DOCUMENTS

| | | |
|---|---|---|
| CN | 105529350 A | 4/2016 |
| CN | 205264706 U | 5/2016 |
| CN | 105895659 A | 8/2016 |
| KR | 20070079946 A | 8/2007 |

OTHER PUBLICATIONS

First Office Action in the Korean Patent Application No. 20187014326, dated Feb. 21, 2019; English translation attached.
First Office Action in the Indian Patent Application No. 201827019384, dated Dec. 20, 2019.
The Extended European Search Report in the European Patent Application No. 17863272.5, dated Dec. 14, 2020.

* cited by examiner

DISPLAY SUBSTRATE AND A DISPLAY APPARATUS

CROSS-REFERENCE TO RELATED APPLICATION

This application is a national stage application under 35 U.S.C. § 371 of International Application No. PCT/CN2017/093689, filed Jul. 20, 2017, which claims priority to Chinese Patent Application No. 201710233157.2, filed Apr. 11, 2017, the contents of which are incorporated by reference in the entirety.

TECHNICAL FIELD

The present invention relates to display technology, more particularly, to a display substrate and a display apparatus.

BACKGROUND

It has been known that human eyes have limited ability to distinguish two separate points with a smallest angle of 1' to the eye pupil center. Assuming that two points on a screen are separated by 1 cm, the farther away of the screen is from the eyes, the smaller is the angle to the eye pupil center. Typically, a person reads a smart phone screen at a distance of 25 cm. At this distance, the smallest distinguishable separation of two points on the smart phone screen is no less than 0.1 mm. As the brightness of the two points increase, the smallest distinguishable separation will be even larger. For a smart phone with QHD display resolution (a quarter of FULL HD of 1920×1080), the nearest distance between two color blocks of a same color is about 0.04 mm (or 0.02 mm for green color blocks). Human eyes hardly distinguish the difference of the two points. If two adjacent pixels emit light at a same time, human eyes only see light as if it emits from a single light-emitting point.

SUMMARY

In one aspect, the present disclosure provides a display substrate including a plurality of pixels arranged in array of matrix. Each pixel includes OLED devices for emitting light of different color. Each OLED device includes at least a first electrode, a second electrode, and an emitting layer located between the first electrode and the second electrode. A Microcavity in each OLED device is formed between a reflective surface of the first electrode and a transflective surface of the second electrode. The microcavity is characterized by an optical length based on a physical distance between the reflective surface and the transflective surface. Particularly, the OLED devices emitting light of same color of the plurality of pixels include at least two microcavities having different optical lengths. Note, a microcavity length of an OLED device is defined by a sum of thicknesses of all layered structures between the reflective surface of the first electrode and the transflective surface of the second electrode. An optical length of a layer equals to a thickness of the layer multiplied by a refractive index of the corresponding layer.

Optionally, the OLED devices emitting light of same color in two adjacent pixels have different microcavities with different optical length and the OLED devices in one pixel have a same microcavity with a same optical length.

Optionally, the OLED devices emitting light of same color in two adjacent pixels have different microcavities with different optical length and at least one of the OLED devices in one pixel has a different microcavity with a different optical length.

Optionally, the OLED devices emitting light of same color in two adjacent pixels have different microcavities with different optical length and each OLED device has at least two microcavities with different optical length.

Optionally, each OLED device further includes an optical functional layer including at least one of a hole transporting layer, an electron transporting layer, a hole injection layer and an electron injection layer between the first electrode and the second electrode. The first electrode includes at least a transparent electrode layer. At least one of the transparent electrode layer, at least one of the optical functional layer, and the emitting layer of each OLED device is adjusted with a different thickness to provide different microcavities for two OLED devices emitting light of same color in two adjacent pixels of the plurality of pixels.

Optionally, the transparent electrode layers of two OLED devices emitting light of same color in two adjacent pixels of the plurality of pixels have different thicknesses.

Optionally, the thicknesses of the transparent electrode layers vary periodically from one pixel to next adjacent pixel.

Optionally, the thicknesses of the transparent electrode layers vary with a ladder distribution over one or more pairs of adjacent pixels of the plurality of pixels.

Optionally, the ladder distribution includes a step size ranging from 1 nm to 8 nm.

Optionally, the first electrode further includes a reflective electrode layer laminated with the transparent electrode layer at a side more distal to the emitting layer.

Optionally, the transparent electrode layer includes at least one material selected from indium gallium oxide, indium zinc oxide, indium tin oxide, and indium gallium tin oxide. The reflective electrode layer includes at least one material selected from silver, magnesium, and aluminum. The second electrode includes at least one material selected from silver, magnesium, and aluminum.

Optionally, the optical functional layers of two OLED devices emitting light of same color respectively in any two adjacent pixels have different thicknesses.

Optionally, the thicknesses of the optical functional layer vary periodically from one pixel to next adjacent pixel.

Optionally, the thicknesses of the optical functional layers vary with a ladder distribution over one or more pairs of adjacent pixels of the plurality of pixels. Optionally, the ladder distribution comprises a step size ranging from 1 nm to 8 nm.

Optionally, the emitting layers of two OLED devices emitting light of same color respectively in two adjacent pixels have different thicknesses.

Optionally, the thicknesses of the emitting layers vary periodically from one pixel to next adjacent pixel.

Optionally, the thicknesses of the emitting layers vary with a ladder distribution over one or more pairs of adjacent pixels of the plurality of pixels.

Optionally, the transparent electrode layers with different thicknesses are disposed separately from each other.

Optionally, each pixel includes three OLED devices respectively emitting red, green, and blue color light, wherein the three OLED devices respectively emitting red, green, and blue light are spatially arranged in a row, a column, or a pentile arrangement.

In another aspect, the present disclosure provides a display apparatus having the display substrate described herein. Optionally, the display substrate is a color filter substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
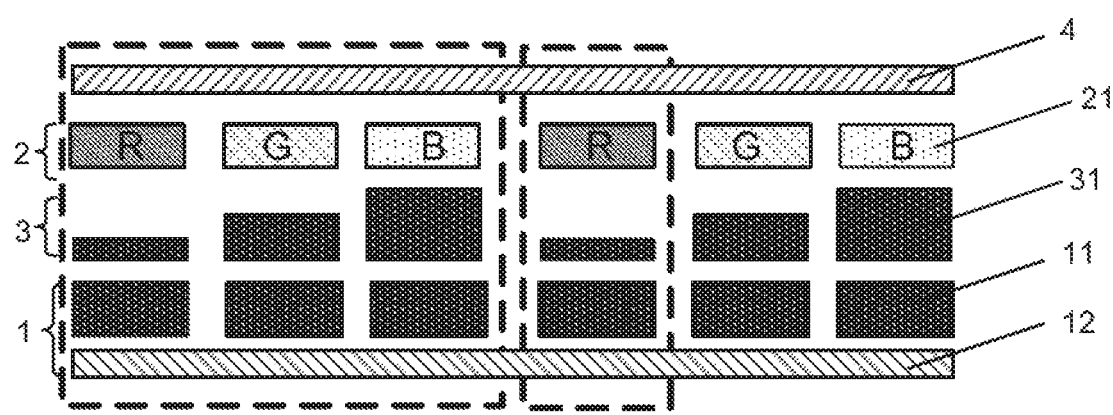
FIG. 1 is a schematic structural diagram of pixels in a conventional display substrate.

Organic Light Emitting Diode (OLED) display devices have been implemented in various display technology fields. An OLED device is used to form a sub-pixel of each pixel of a display substrate. FIG. 1 shows a schematic diagram of a pixel with three colors of a conventional OLED display substrate. Each pixel and each sub-pixel of a single color are respectively marked by dashed lines. Emission spectrum of organic light emitting material in the OLED device is generally wide. In order to narrow the emission spectrum of OLED device, a microcavity structure is introduced to the OLED device to enhance display chromaticity and emitting intensity for certain wavelength as well as to change color of emitted light of OLED device. A microcavity in an OLED device in a sub-pixel is a multilayered structure including a first electrode 1, a second electrode 4, an emitting layer 2, an optical functional layer 3. The first electrode 1 includes a reflective electrode layer 12 and a transparent electrode layer 11. The optical functional layer 3 includes at least a hole transporting layer (HTL) 31. The emitting layer 2 of a certain color in each sub-pixel is also denoted as layer 21.

In the conventional display substrate of FIG. 1, OLED devices emitting light of different color in a same pixel have different HTLs of different thicknesses but the OLED devices of a same color in different pixels have HTLs of a same thickness. Although the microcavity structure in the OLED device does narrow the emission spectrum, an issue of the intensity variation and color shift over different view angles for the conventional OLED display remains to be improved. Accordingly, the present disclosure provides, inter alia, a display substrate and a display apparatus having the same that at least partially obviate one or more of the problems due to limitations and disadvantages of the related art, especially for high-resolution display apparatus.

In an aspect, the present disclosure provides an improved OLED display substrate. In the OLED display substrate of the present disclosure, two OLED devices in two sub-pixels emitting light of same color in any two adjacent pixels are made into two microcavities with different cavity lengths act as two parts of a single point emitting light of a same color. Alternatively, one or two OLED devices emitting light of different color in a same pixel are made with at least two microcavities with different cavity lengths. In this way, the viewing characteristic of the display substrate is modified to provide better emission intensity and color uniformity in different perspective view angles.

In some embodiments, the OLED display substrate includes a plurality of pixels arranged in array of matrix. Each pixel includes OLED devices for emitting light of different color. Each OLED device includes at least a first electrode, a second electrode, and an emitting layer located between the first electrode and the second electrode. Optionally, the first electrode is an anode and the second electrode is a cathode. Optionally, the anode and the cathode can be interchanged. The first electrode includes a reflective surface and the second electrode includes a transflective surface. A microcavity is formed between the reflective surface and the transflective surface characterized by an optical length. The OLED devices emitting light of same color in any two adjacent pixels have different microcavities with different optical lengths varied with certain distributions from pixel to pixel. Alternatively, at least one OLED device in one pixel has a microcavity with a different optical length from that of other OLED devices in the same pixel. Note, different optical length of the microcavity is referred to different total thickness values of all layered structures between the reflective surface of the first electrode and the transflective surface of the second electrode for each OLED device. Or, the different optical length of the microcavity can be obtained by adjusting at least a different thickness any one layer among all layered structures between the first electrode and the second electrode of each OLED device although the total thickness of all layered structures remains the same. In other words, change a thickness of each layer may change the optical length (different layer has different refractive index), but the total thickness of all physical layers of the microcavity can be the same. By combining two emission points of the same colored light in two adjacent pixels, the issue of varying intensity and color shift over different perspective viewing angles in the display substrate can be at least partially corrected.

In some embodiments, the present disclosure provides a display substrate based on array of OLED devices each containing an optical microcavity for narrowing emission spectrum for particular wavelengths. Additionally, the microcavity structures of the OLED devices are improved by combining emitting points of a same color in adjacent pixels to obtain better emission intensity and less color shift at different perspective view angles with more stable color coordinates for the display substrate.

The OLED-based display substrate includes a plurality of pixels arranged periodically. Each pixel includes multiple emitting sub-pixels for different colors. Each sub-pixel includes an OLED device emitting light of a color. Each OLED device is formed with a microcavity having a particular optical length.

Figure 2:
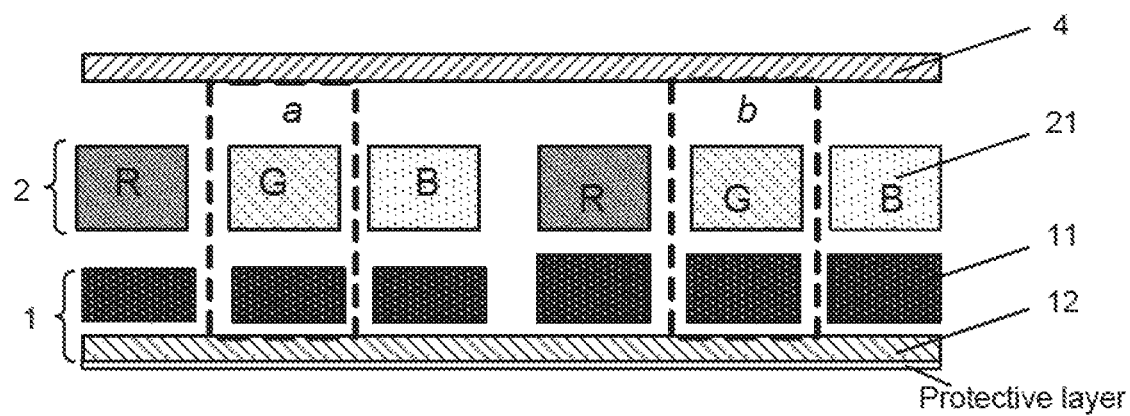
FIG. 2 is a schematic structural diagram of an organic light emitting diode device in a display substrate according to an embodiment of the present disclosure.

FIG. 2 is a schematic structural diagram of an OLED device in a display substrate according to some embodiments of the present disclosure. Referring to FIG. 2, the display substrate includes a plurality of pixels arranged in array of matrix. Each pixel includes several OLED devices having an emitting layer 2 formed between a first electrode 1 and a second electrode 4. Each OLED includes a separate kind of emitting layer 21 respectively for emitting light of different color. The first electrode 1 includes at least a transparent electrode layer 11 which is electrically conductive element of the first electrode for providing driving current to the OLED device. In the embodiment, the transparent electrode layers 11 in any two OLED devices emitting light of same color belonging respectively to two adjacent pixels have different thicknesses varying in certain distributions. For example, the distribution can be a periodic cyclic distribution. Under a condition that a distance of two emitting points of two OLED devices with respective microcavities in two adjacent pixels is smaller than the distance that can be resolved by the human eyes, the periodic cyclic distribution would be an easily achievable in manufacture processes for arranging the thicknesses of transparent electrode layers 11 in different OLED devices. By modifying the thicknesses of transparent electrode layers 11, different OLED devices can be formed with different microcavities with different optical lengths. By combining emitting points with same color in adjacent pixels, the intensity and chromaticity characteristics of the display substrate at different perspective view angles can be substantially improved.

In the embodiment, OLED devices include three types respectively emitting red (R), green (G), and blue (B) color light. The arrangement of the three types of OLED devices is in order of R, G, and B arranged in a row, a column, or a pentile line arrangement. The display substrate of this disclosure is not limited by any specific OLED device arrangement mentioned above or any others. As long as two transparent electrode layers of two OLED devices of a same color in any adjacent pixels have different thicknesses, they can be combined to act as a single emitting point for improving display quality in terms of intensity and chromaticity at different perspective view angles.

In the embodiment, the transparent electrode layers 11 of the OLED devices in each sub-pixel of a same pixel emitting light of different color have a same thickness, simplifying manufacturing process for making the transparent electrode layer 11.

Optionally, in each of the OLED device of the display substrate, the first electrode 1 also includes a reflective electrode layer 12 laminated with the transparent electrode layer 11 at a side more distal to the emitting layer 2. The reflective electrode layer 12 is configured to provide complete reflection to the emitted light. In the embodiment, the second electrode 4 is configured to have a transflective surface, i.e., a semi-reflective and semi-transmissive surface, for the emitted light. The microcavity for each OLED device is formed by the layered structures between the reflective electrode layer 12 of the first electrode 1 and the transflective surface of the second electrode 4 as an optical cavity. The reflective electrode layer 12 and the transflective surface provide an enhanced microcavity effect, forming a resonance of light within the microcavity by reflecting the light back and forth. The resonance of light essentially is due to multi-beam enhanced interference which induces three major effects: increase of light intensity, selection of spectrum peak position and narrowing of emission spectrum, and change of spectrum and intensity observed in non-front (perspective angled) direction.

In the embodiment, two OLED devices of two sub-pixels of a same color in two adjacent pixels of the display substrate include respective two microcavities a and b, as shown in FIG. 2 as an example, corresponding to two emission spectra and two intensities. Due the distance between each other being so close and non-distinguishable to human eyes, the spectra and intensities of the two microcavities in the two pixels can be superimposed to have a similar effect as one sub-pixel of the same color in one pixel with a spectrum and intensity represented by (a+b)/2. Because the optical lengths of the two microcavities are different, the change of spectrum for the microcavity a and microcavity b at a perspective view angle is also different (i.e., corresponding to different color shift) and relatively large. But as the microcavity a and microcavity b are combined to form superimposed spectra, a compensation effect is achieved to make the color shift smaller at the perspective view angle. For an OLED device with a microcavity, if its front view intensity is high, its perspective view color shift will drop noticeably. The present disclosed display substrate advantageously combine a microcavity a with high front view intensity with a microcavity b with less front view intensity but higher perspective view intensity. A balance between the front view intensity and perspective view intensity may be found by superimposing the microcavity a and microcavity b so that the intensity and color shift of the display can be adjusted using different optical lengths of different microcavities of different OLED devices emitting the same colored light.

In a specific implementation of the embodiment, the transparent electrode layers of all OLED devices emitting light of same color in any two adjacent pixels have different thicknesses varied with a ladder distribution over one or more pairs of adjacent pixels of the plurality of pixels. In other words, in the ladder distribution, the number of steps can be equal to or greater than 2. Based on a current pixel, in all adjacent pixels the thickness of the transparent electrode layer can be 1×, 2×, or other multiples of that in the current pixel. The embodiment can be applicable for any two OLED devices of same color with microcavities in reasonable optical length variation ranges that can be combined to form a single emitting point.

In another specific implementation of the embodiment, a lateral pattern of the transparent electrode layer can be a square shape or a ring shape, or any other shape as long as it is facilitated for manufacture process as well as good display effect.

The specific thickness value is not limited. Based on color sensitivity of the microcavity, the ladder distribution for different sub-pixels of different color may be different. For example, blue light is most sensitive to microcavity length change, so that the range of its ladder distribution is set small. Red light is least sensitive to microcavity length change so that the range of its ladder distribution is set large. Optionally, the ladder distribution of the transparent electrode layers in adjacent pixels is configured with a step size ranging from 1 nm to 8 nm. It is preferred to set the ladder distribution step size of the transparent electrode layer within the above ranges for different colors to facilitate the formation of the combined emitting point.

Optionally, the transparent electrode layer 11 is made by at least one material selected from indium gallium oxide, indium zinc oxide, indium tin oxide, and indium gallium tin oxide. The reflective electrode layer 12 is made by at least one material selected from silver, magnesium, and aluminum. The second electrode 4 is made by at least one material selected from silver, magnesium, and aluminum. Typically, the first electrode 1 is a multi-layer structure including indium tin oxide/silver indium tin oxide. In the embodiment 1, the first electrode 1 includes a transparent electrode layer 11 in indium tin oxide (ITO) and a reflective electrode layer 12 in silver (Ag). The materials for making the transparent electrode layer 11, reflective electrode layer 12, and the second electrode 4 are easily acquired. Manufacture processes are well matured for achieving good reflection and display effect.

Optionally, in the OLED device shown in FIG. 2, the reflective electrode layer 12 is formed by silver (Ag) with a thickness about 100 nm, the transparent electrode layer 11 (being a major conductive layer in the first electrode 1) and the second electrode 4 are mode by magnesium (Mg) forming a semi-transparent film with a thickness range of 10-20 nm. Optionally, the thickness is 14 nm.

Referring to FIG. 2, in the OLED devices of two adjacent pixels from bottom to top, the layered structure is provided as the first electrode 1 (reflective electrode 12 and transparent electrode layer 11), the emitting layer 2 (denoted for multiple sub-pixels with corresponding emitting layers 21), and the second electrode 4. The reflective electrode layer 12 is disposed above the substrate. The reflective electrode layer 11 of the same color in the adjacent pixels has a different thickness. A microcavity is formed between the reflective electrode layer 12 of the first electrode 1 and the second electrode 4. In some embodiments, adjusting the thickness of the transparent electrode layer 11 is used to adjust optical length of the microcavity of the OLED device of the same color in adjacent pixels.

Optionally, each upper layer of the OLED device is formed via a deposition process based on its material characteristics respectively overlying a top surface of each lower layer. The optical length of the microcavity actually is a affected by the total thickness of all layers therein and respective refractive index of each layer.

In a conventional display substrate, the emitting layers of different OLED devices of different color in a same pixel are made by different materials with different thicknesses while corresponding to respective transparent electrode layers of a same thickness and the emitting layer of different OLED devices of same color in two different pixels corresponds to respective transparent electrode layers of a same thickness. In the display substrate of the present disclosure, during its formation process, on top of the reflective electrode layer 12 (Ag) of the first electrode 1, ITO material with different thicknesses is formed as the transparent electrode layer 11 at different regions having a same color in adjacent pixels using a lithography process. Afterward, different emitting layers for different colors are deposited at respective regions to form the emitting layer 2 (EL). Then, the second electrode 4 is formed. In an embodiment, sputtering deposition is used for depositing ITO material to ensure the formation of different thicknesses formed at corresponding different OLED devices of different sub-pixels of same color in adjacent pixels, so that the perspective view characteristics of the OLED devices can be improved. Optionally, the ITO material etching method is used for making the transparent electrode layer 11 into different patterns such as square shape or ring shape or others.

In some embodiments, within the OLED device of the display substrate, the first electrode 1 also includes a protective electrode layer disposed at a side of the reflective electrode layer 12 more distal to the transparent electrode layer 11. The protective electrode layer usually is also a transparent layer (e.g., ITO material) used to prevent the transparent electrode layer from being corroded. The protective electrode layer also is able to prevent silver material in the first electrode 1 from diffusing into the regions where thin-film transistors are formed underneath as pixel driving devices, which otherwise would affect the performance characteristics of the thin-film transistors.

Figure 3:
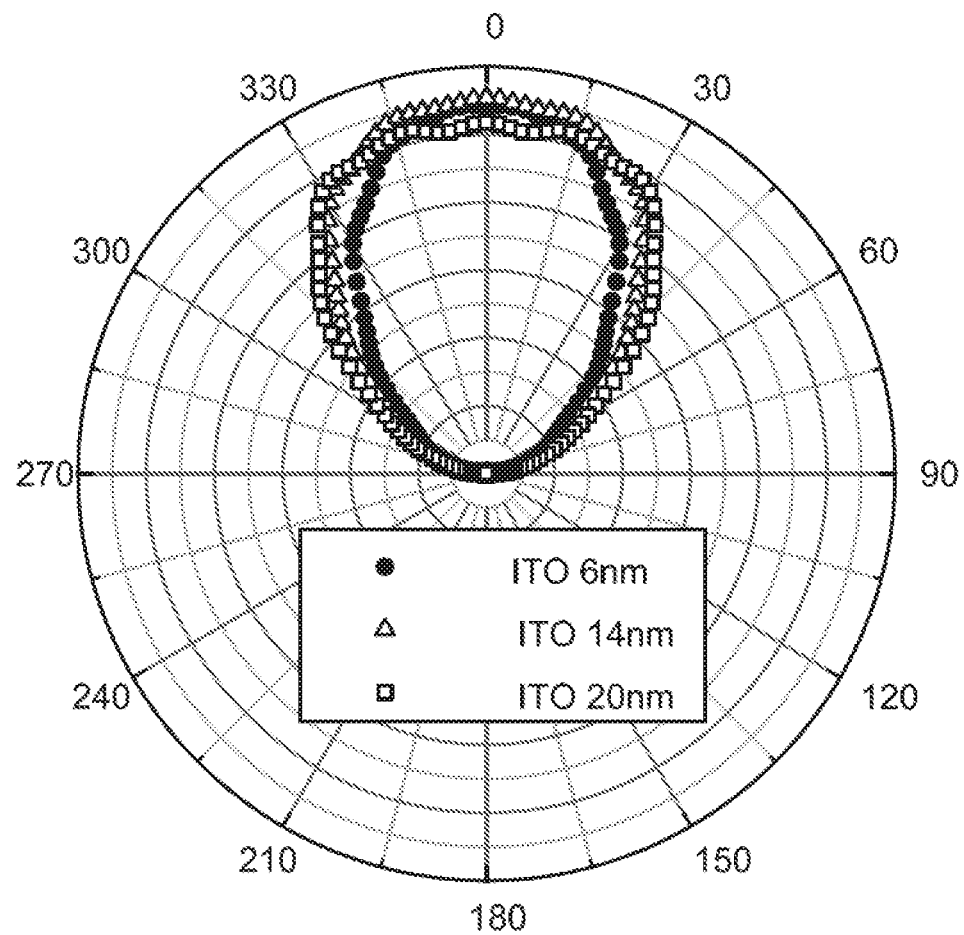
FIG. 3 is a Lambertian body brightness plot of the organic light emitting diode device of FIG. 2 according to an embodiment of the present disclosure.

FIG. 3 is a Lambertian body brightness plot of the OLED device of FIG. 2 according to an embodiment of the present disclosure. The Lambertian body brightness plot is a plot of intensity values at different angles in a polar coordinate system. For a specific thickness of a transparent electrode layer 11, a curve of intensities is obtained. In the figure, the CIEx and CIEy are color coordinates corresponding to CIE1931 chromaticity coordinate map. By conversion, color coordinates u and v corresponding to CIE1976 are obtained. The parameters $\Delta u'$ $\Delta v'$ are calculated to represent corresponding color shifts. Referring to FIG. 3, for the transparent electrode layer 11 in ITO material with a thickness of 6 nm or 14 nm or 20 nm, a simulation result shows that the emission intensity at front view angle (e.g., view angle of 0 degree) for 6 nm or 14 nm is larger than that for 20 nm. But the emission intensity at large perspective view angle for 6 nm or 14 nm is smaller than that for 20 nm. When using the combined emission point of two mixed sub-pixels, one with a 6 nm transparent electrode layer and another with a 20 nm transparent electrode layer, from two adjacent pixels, the emission intensity at perspective view angle can be improved. By introducing two different thicknesses for the two transparent electrode layers 11 in two OLED devices in two adjacent pixels, the intensity value of the combined emitting point can be treated as ½ of the sum of the intensities of the two OLED devices with transparent electrode layers in respective different thicknesses, because that human eyes cannot distinguish that they are two separate pixels but to view than as a single emitting point. Based on this principle, the display substrate disclosed herein may chose one OLED device with a transparent electrode layer in a first thickness corresponding to relative higher intensity at front view while poorer intensity at large perspective view angle to combine with another OLED device (in an adjacent pixel emitting light of same color) with a transparent electrode layer in a second thickness corresponding to relative poorer intensity at front while relative stronger intensify at large perspective view angle to achieve mutual compensation. Therefore, the combined emitting point can achieve new balances in all aspects including perspective view angle, intensity, and color shift, leading to a generally optimized effect of emission intensity and color shift at various view angles.

Additionally, in terms of emission spectrum, color shift results at different angles are obtained for different OLED devices with microcavities in different optical lengths. Table 1 shows the results. For different optical lengths of the microcavities in different OLED devices, the emission spectrum peak position is slightly shifted. The corresponding color coordinates are calculated based on the corresponding emission spectrum. Based on the data in Table 1, a following conclusion can be drawn: as the spectrum of one combined emitting point is superimposed from two spectra respectively associated with two separate transparent electrode layer 11 and regularly changed with the change of perspective view angles, the combined spectrum can be tuned such that the respective two spectra are mutually offset or compensated to make the change of color coordinates with the spectrum to become smaller. Thus, the change of spectrum (or color shift) from a front view angle to a large perspective view angle for the combined emitting point corresponding to two different OLED devices with different transparent electrode layers will be relatively smaller than that for each original emitting point corresponding to each individual OLED device with its own transparent electrode layer.

TABLE 1

|  | Angles | CIEx | CIEy | Δn'Δv' |
|---|---|---|---|---|
| 6 nm + 20 nm Mixed pixel | 0 | 0.2633 | 0.7 | 0 |
|  | 60 | 0.2597 | 0.6903 | 0.00226 |
| 6 nm | 0 | 0.219182 | 0.709408 | 0 |
|  | 60 | 0.233028 | 0.679118 | 0.009207 |
| 14 nm | 0 | 0.253429 | 0.700664 | 0 |
|  | 60 | 0.236167 | 0.67489 | 0.008 |
| 20 mu | 0 | 0.786973 | 0.681878 | 0 |
|  | 60 | 0.242073 | 0.675238 | 0.018083 |

The display substrate disclosed in some embodiments is configured, by adjusting thicknesses of transparent electrode layer of different OLED devices of same color in adjacent pixels to form different microcavities with different optical lengths, to make the two adjacent pixels emitting same colored light to become two emitting points with different optical lengths. As the two emitting points are combined, the color shift of emission spectrum is substantially reduced without causing emission intensity at front view angle to reduce and the emission intensity at large perspective view angle is also enhanced to some degrees. This results in overall improvement to the perspective view characteristics of the display substrate, especially for high-resolution display products due to limited ability of human eyes to distinguish the combined emitting point from the two separate emitting points.

The display substrate of the embodiment described above is applicable for improving microcavity structure of a top-emission type OLED device. Alternatively, the embodiment also can be applied to separately adjust color shift of a single color OLED device in any sub-pixel of any pixel to reduce color shift of white light and applied to adjust color gamut of a display apparatus having the same display substrate.

In some alternative embodiments, a display substrate based on array of OLED devices is provided with each OLED device containing an optical microcavity structure for narrowing emission spectrum for particular wavelengths. Additionally, the optical microcavity structures of the OLED devices are improved by combining emitting points of a same color in adjacent pixels to obtain better emission intensity and less color shift at different perspective view angles with more stable color coordinates for the display substrate.

The OLED-based display substrate of the present disclosure includes a plurality of pixels arranged periodically. Each pixel includes multiple emitting sub-pixels for different colors. Each subpixel emitting any colored light constitutes an OLED device with a particular microcavity. Optionally, all emitting sub-pixels are disposed on top of the display substrate as in state-of-art OLED displays.

Figure 4:
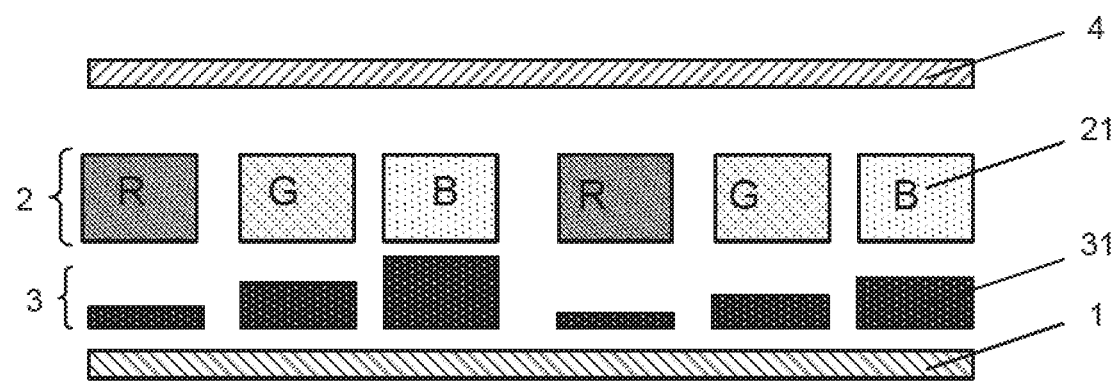
FIG. 4 is a schematic structural diagram of an organic light emitting diode device in a display substrate according to another embodiment of the present disclosure.

FIG. 4 is a schematic structural diagram of an organic light emitting diode device in a display substrate according to the alternative embodiments of the present disclosure. Referring to FIG. 4, the display substrate includes a plurality of pixels arranged in array of matrix. Each pixel includes OLED devices respectively for emitting light of different color. In particular, the OLED device further includes an optical functional layer 3 located between the first electrode 1 and the second electrode 4. The optical functional layer 3 includes at least a hole transporting layer 31 (HTL) for each OLED device. In the embodiment, the HTLs 31 in OLED devices of any two sub-pixels of same color in adjacent pixels have different thicknesses. By modifying the thicknesses of the HTLs 31, different OLED devices can be formed with different microcavities with different optical lengths. By combining emitting points at different sub-pixels with same color in adjacent pixels, the intensity and chromaticity characteristics of the display substrate at different perspective view angles can be substantially improved.

Optionally, the functional layer also includes other functional layers including but not limiting a hole injection layer, an electron injection layer, and an electron transporting layer. It can be done to adjust each thickness of each type of optical functional layers to achieve similar effect of adjusting optical lengths of microcavities as the adjustment for the HTLs. Here, just using description on the adjustment of HTLs as an example of adjusting the optical functional layer to achieve adjustment of different microcavities for each OLED device.

In general, the thicknesses of HTLs are in different OLED devices of different sub-pixel of different colors, neither are the optical lengths of corresponding microcavities. For example, HTL of OLED device in a sub-pixel of green color has a thickness of about 150 nm. Optionally, the HTLs of OLED devices in adjacent pixels have a thickness variation in a periodic cyclic distribution. Optionally, the HTLs of OLED devices of different sub-pixels of different colors in adjacent pixels have a thickness variation in a ladder distribution over one or more pairs of adjacent pixels. The ladder distribution associated with different color sub-pixels is configured to have different step size. Blue light is the most sensitive color to the microcavity length change, so the step size of the HTL ladder distribution for blue color sub-pixels is set relatively small. Red light is the least sensitive color to the microcavity length change, so the step size of the HTL ladder distribution for red color sub-pixels is set relatively large. The step size for all colors is in a range from 1 nm to 8 nm for facilitating the formation of combined emitting point based on two OLED devices with different HTL thicknesses in two sub-pixels of a same color in adjacent pixels. Optionally, a lateral pattern of each HTL for each sub-pixel can be a square shape or a ring shape or other shape that facilitates manufacture of the HTLs with simplified processes yielding good display effect.

Referring to FIG. 4, layered structures of OLED devices are shown for two adjacent pixels. From bottom to top, the layered structure includes an first electrode 1 (including at least a reflective electrode layer 12 of Ag material and 100 nm in thickness and a transparent electrode layer 11 of ITO material), a hole transposing layer 31, an emitting layer 21 (EL), and a second electrode 4 (of Mg:Ag alloy material, 10-20 nm in thickness, as a semi-transparent film). The OLED device forms a microcavity between the reflective electrode layer 12 and the second electrode 4. The optical length of the microcavity can be adjusted by adjusting thickness of the HTL 31 in the microcavity of each OLED device.

Figure 5:
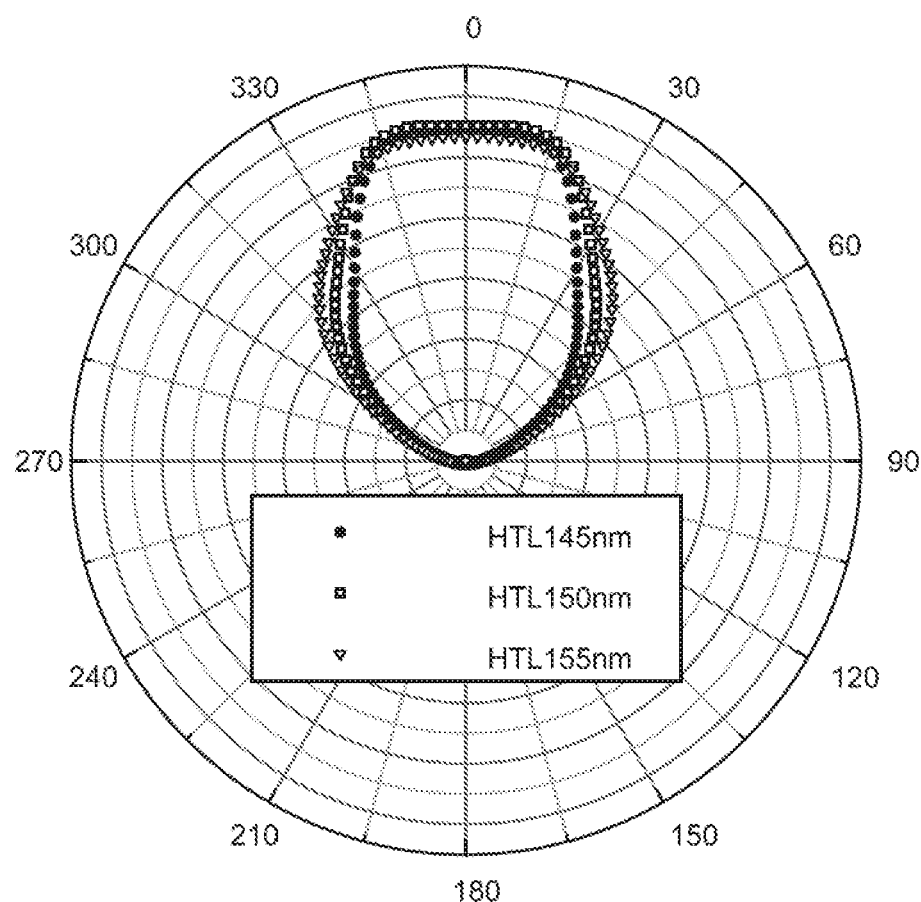
FIG. 5 is a Lambertian body brightness plot of the organic light emitting diode device of FIG. 4 according to another embodiment of the present disclosure.

FIG. 5 is a Lambertian body brightness plot of the OLED device of FIG. 4 according to an embodiment of the present disclosure. The Lambertian body brightness plot is a plot of intensity values at different angles in a polar coordinate system. For a specific thickness of a HTL, a curve of intensities is plotted in FIG. 5. As the two OLED devices in the adjacent pixels are introduced with two HTLs of different thicknesses and two emitting points associated with the two OLED devices are combined, the intensity of the combined emitting point is a half of sum of emitting intensities two OLED devices with a single thickness of HTLs. In the embodiment, the display substrate can be formed by selecting an OLED device with a HTL thickness corresponding to a relative high front view intensity while relative poor intensity at large perspective view angle to combine with another OLED device at the adjacent pixel with a HTL thickness corresponding to a lower front view intensity while relative strong intensity at large perspective view angle.

Additionally, in terms of emission spectrum, color shift results at different angles are obtained for different OLED devices with microcavities in different optical lengths. Table 2 shows the results for different thicknesses of HTLs. For different optical lengths of microcavities in different OLED devices, the emission spectrum peak position is slightly shifted. The corresponding color coordinates are calculated based on the corresponding emission spectrum. Based on the data in Table 2, a following conclusion can be drawn: as the spectrum of one combined emitting point is superimposed from two spectra respectively associated with two HTLs with single thickness the change of spectrum (or color shift) from a front view angle to a large perspective view angle for the combined emitting point corresponding to two different OLED devices with different HTLs will be relatively smaller than that for each original emitting point corresponding to each individual OLED device with its own HTL of single thickness. As seen in Table 2, the color shift of the combined emitting point is smaller than that of original emitting point associated with single HTL thickness. For

TABLE 2

|  | Angles | CIEx | CIEy | Δu'Δv' |
| --- | --- | --- | --- | --- |
| 145 nm + 155 nm | 0 | 0.2651 | 0.7 | 0 |
| Mixed pixel | 60 | 0.2305 | 0.7098 | 0.014281 |
| 150 nm + 155 nm | 0 | 0.2724 | 0.6971 | 0 |
| Mixed pixel | 60 | 0.231 | 0.7095 | 0.017217 |
| 145 nm | 0 | 0.277508 | 0.706337 | 0 |
|  | 60 | 0.203398 | 0.694228 | 0.009436 |
| 150 nm | 0 | 0.250687 | 0.700179 | 0 |
|  | 60 | 0.20492 | 0.694363 | 0.017956 |
| 150 nm | 0 | 0.27973 | 0.685392 | 0 |
|  | 60 | 0.20712 | 0.69612 | 0.029721 | example the color shift for a combined emitting point from a mixed pixel with 145 nm HTL+155 nm HTL is smaller than each individual pixel with 155 nm HTL. Introducing 145 nm HTL at the adjacent pixel for forming a combined emitting point improves color shift characteristics of the display substrate.

In a conventional display substrate, OLED devices of different color in a same pixel have HTLs with different thicknesses, and OLED devices of a same color in different pixels have HTLs with a same thickness. In the display substrate of the present disclosure, during its manufacture process, OLED devices of a same color in adjacent pixels are made by a vapor deposition on top of the first electrode 1 via a fine metal mask method to produce different HTLs 31 with different thicknesses. The emitting layer 2 and the second electrode 4 are deposited afterwards to ensure formations of different thicknesses in HTLs 31 of different OLED devices in sub-pixels of the same color in adjacent pixels. These HTLs 31 with different thicknesses act as microcavities with different optical lengths for improving perspective view characteristics of the OLED devices. For example, by either using a mixed pixel with a 145 nm HTL and a 155 nm HTL to form a combined emitting point or using a mixed pixel with a 150 nm HTL and a 155 nm HTL to form a combined emitting point, the intensity and color shift characteristics of the display substrate at large perspective view angles can be improved.

In a specific example, simulation results for the OLED device for emitting green color light are shown in FIG. 5 in terms of Lambertian body map and also shown as test data in the Table 2. For HTL of 145 nm or 150 nm, the simulation result shows the emitting intensity at front view angle is stronger than that for HTL of 155 nm but the intensity at large perspective view angles is smaller than that for HTL of 155 nm. As the combined emitting point is used, the intensity at perspective view angle is enhanced. As seen from the data in Table 2, the color shift issue is also improved if the combined emitting point is used.

The display substrate disclosed in the embodiment described above is configured, by adjusting thicknesses of one of optical functional layer such as a hole transporting layer of different OLED devices of same color in adjacent pixels to form different microcavities with different optical lengths, to make the two adjacent pixels emitting light of same color to become two emitting points with different optical lengths. As the two emitting points are combined, the color shift of emission spectrum is substantially reduced without causing emission intensity at front view angle to reduce and the emission intensity at large perspective view angle is also enhanced to some degrees. This results in overall improvement to the perspective view characteristics of the display substrate, especially for high-resolution display products due to limited ability of human eyes to distinguish the combined emitting point from the two separate emitting points.

The display substrate of the present embodiment is applicable for improving microcavity structure of a top-emission type OLED device. Alternatively, the embodiment also can be applied to separately adjust color shift of a single color OLED device in any sub-pixel of any pixel to reduce color shift of white light and applied to adjust color gamut of a display apparatus having the same display substrate.

Figure 6:
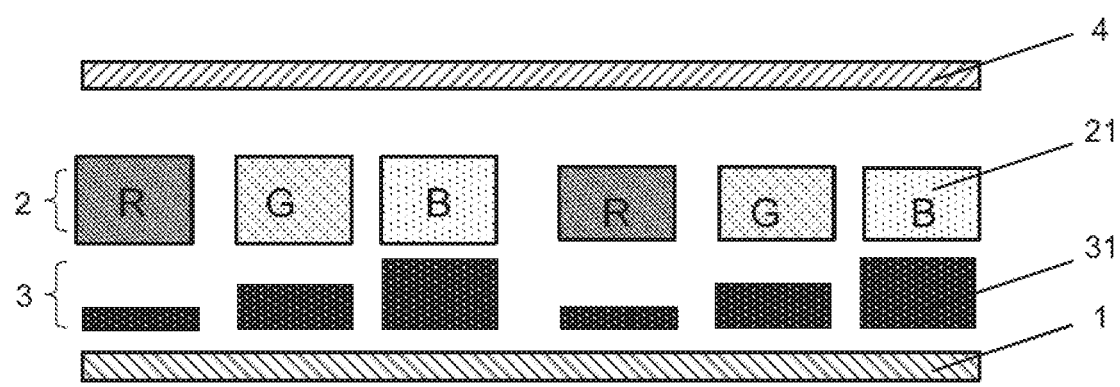
FIG. 6 is a schematic structural diagram of an organic light emitting diode device in a display substrate according to yet another embodiment of the present disclosure.

FIG. 6 is a schematic structural diagram of an organic light emitting diode device in a display substrate according to some other embodiments of the present disclosure. Referring to FIG. 6, in the OLED display substrate, the emitting layers 2 of OLED devices of different sub-pixels in two adjacent pixels have different thicknesses. By modifying the thicknesses of the emitting layers 2, different microcavities in the OLED devices can be formed with different optical lengths. By combining emitting points at different sub-pixels with same color in adjacent pixels, the intensity and chromaticity characteristics of the display substrate at different perspective view angles can be substantially improved.

In the display substrate of the present embodiment the emitting layers of different OLED devices in adjacent pixels have thickness variation in a periodic cyclic distribution. Optionally, the thicknesses of emitting layers of OLED devices of a same color in adjacent pixels are varied in a ladder distribution over one or more pairs of adjacent pixels.

The display substrate disclosed in the present embodiment is configured, by adjusting thicknesses of emitting layers of different OLED devices of same color in adjacent pixels to form different microcavities with different optical lengths, to make the two adjacent pixels emitting same colored light to become two emitting points with different optical lengths. As the two emitting points are combined, the color shift of emission spectrum is substantially reduced without causing emission intensity at front view angle to reduce and the emission intensity at large perspective view angle is also enhanced to some degrees. This results in overall improvement to the perspective view characteristics of the display substrate, especially for high-resolution display products due to limited ability of human eyes to distinguish the combined emitting point from the two separate emitting points.

The display substrate of the present embodiment is especially applicable for improving microcavity structure of a top-emission type OLED device. Alternatively, the embodiment also can be applied to separately adjust color shift of a single color OLED device in any sub-pixel of any pixel to reduce color shift of white light and applied to adjust color gamut of a display apparatus having the same display substrate.

Figure 7:
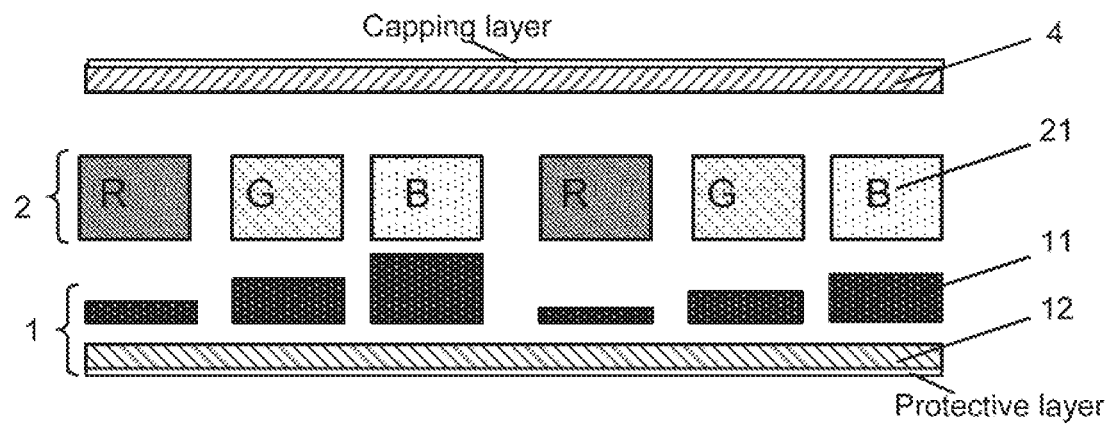
FIG. 7 is a schematic structural diagram of an organic light emitting diode device in a display substrate according to yet still another embodiment of the present disclosure.

FIG. 7 is a schematic structural diagram of an organic light emitting diode device in a display substrate according to some additional embodiments of the present disclosure. Referring to FIG. 7, the transparent electrode layer 11 (in the first electrode 1) of OLED devices of a same color in adjacent pixels have different thicknesses and the transparent electrode layers of different OLED devices in a same pixel have also different thicknesses. By modifying the thicknesses of the transparent electrode layers 11 in the first electrode 1, different microcavities in the OLED devices can be formed with different optical lengths. By combining emitting points at different sub-pixels with same color in adjacent pixels, the intensity and chromaticity characteristics of the display substrate at different perspective view angles can be substantially improved.

Referring to FIG. 7, optionally, the transparent electrode layer 11 includes multiple mutually separated blocks. Each transparent electrode block is made by ITO material with a gap distance between each other. In a same pixel, the transparent electrode blocks associated with different sub-pixel OLED devices of different color must not be in contact. The gap distance between the neighboring transparent electrode blocks is configured to a minimum value that is controllable under the state-of-art process to ensure certain pixel aperture rate. As no contact exists between different transparent electrode blocks of different thicknesses, tip discharge effect can be avoided so as to ensure stable performance of the OLED devices.

In the display substrate of the present embodiment, the first electrode 1 also includes a protective electrode layer disposed on the side of the reflective electrode layer 12 more distal to the transparent electrode layer 11. This protective electrode layer is typically made by transparent material used for protecting the transparent electrode layer 12 from corrosion. The protective electrode layer also is configured to prevent Ag material (in the reflective electrode layer 12) from diffusing into regions where the thin-film transistors (TFTs) as pixel driving devices are located under the protection electrode layer so as not to affect the performance characteristics of the TFTs.

The display substrate disclosed in the present embodiment is configured, by adjusting thicknesses of transparent electrode layers of different OLED devices of same color in adjacent pixels to form different microcavities with different optical lengths, to make the two adjacent pixels emitting same colored light to become two emitting points with different optical lengths. As the two emitting points are combined, the color shift of emission spectrum is substantially reduced without causing emission intensity at front view angle to reduce and the emission intensity at large perspective view angle is also enhanced to some degrees. This results in overall improvement to the perspective view characteristics of the display substrate, especially for high-resolution display products due to limited ability of human eyes to distinguish the combined emitting point from the two separate emitting points.

The display substrate of the present embodiment includes a plurality of pixels arrange periodically. Each pixel includes different emitting sub-pixels of different colors. Each sub-pixel of a certain color includes an OLED device configured with a different microcavity structure. Referring to FIG. 7, in each of the OLED devices of different sub-pixels of a same pixel, on top of a reflective electrode layer 12, a transparent electrode layer 11, an emitting layer 21, and a second electrode 4 with different layer thicknesses are disposed. The second electrode 1 also includes a protective electrode layer, which is also called a capping layer (CPL), overlying a surface of the second electrode for enhancing light transmission rate of metal material of the second electrode to reduce optical loss thereof.

In a conventional display substrate, OLED devices of different color in a same pixel have different transparent electrode layers of different thicknesses and OLED devices of a same color in different pixels have transparent electrode layers with a same thickness. In the display substrate of the present disclosure, during its manufacture process, OLED devices of a same color in adjacent pixels are made by a vapor deposition on top of the reflective electrode layer (Ag material) of the first electrode 1 to produce different transparent electrode layers (ITO material) via with different thicknesses a lithography method. The emitting layer 2 and the second electrode 4 are deposited afterwards to ensure formations of different thicknesses in transparent electrode layers for different OLED devices in sub-pixels of the same color in adjacent pixels. These transparent electrode layers with different thicknesses act as microcavities with different optical lengths for improving perspective view characteristics of the OLED devices. Etching processes of the ITO material for forming various shapes such as square or ring can be varied and not limited herein.

Figure 8:
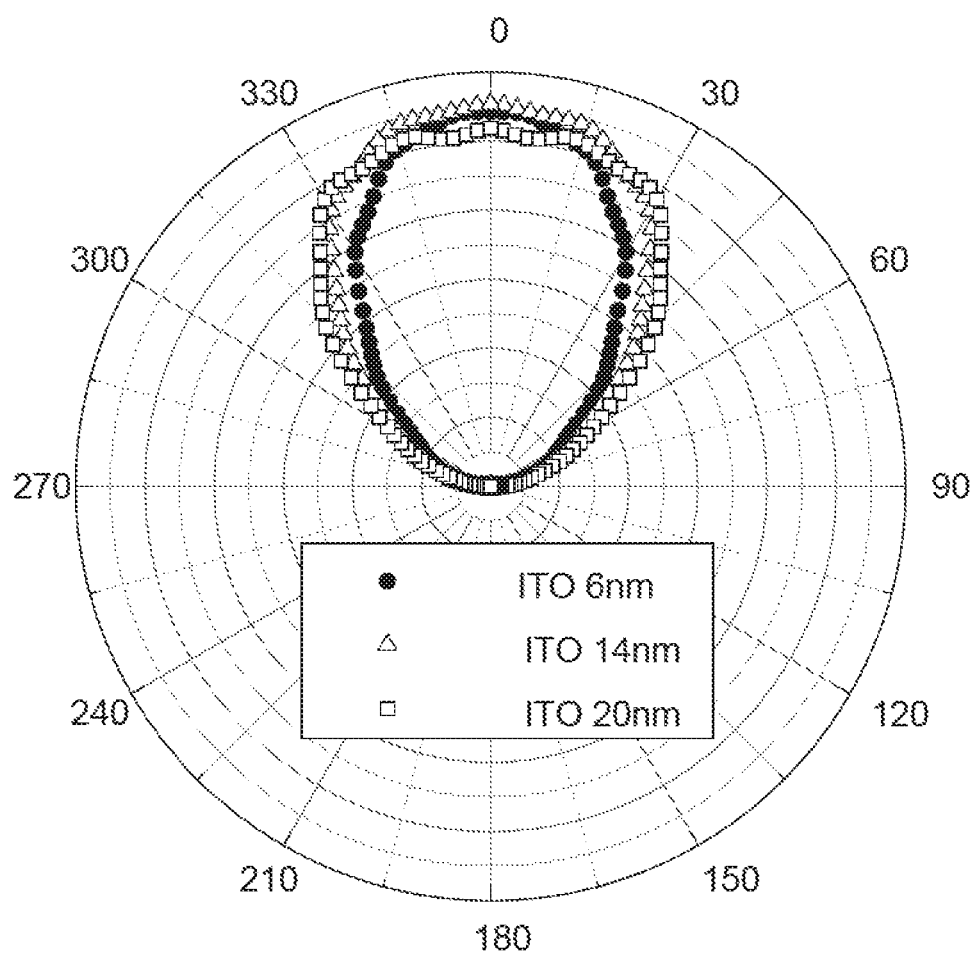
FIG. 8 is a Lambertian body brightness plot of the organic light emitting diode device of FIG. 7 according to another embodiment of the present disclosure.

FIG. 8 is a Lambertian body brightness plot of the organic light emitting diode device of FIG. 7 according to some embodiments of the present disclosure. Simulation results based on the display substrate of the embodiments in FIG. 8 and Table 3 show the intensity color shift over different perspective view angles. Referring to FIG. 8, measurement data indicate that simulation results of front emitted intensity for a 6 nm ITO (as a transparent electrode layer) or a 14 nm ITO is greater than that for 20 nm ITO. But emitted intensity at large perspective view angles for 6 nm or 14 nm ITO is smaller than that for 20 nm ITO. For example, by either using a mixed pixel with a 6 nm ITO and a 20 nm ITO to form a combined emitting point or using a mixed pixel with a 14 nm ITO and a 20 nm ITO to form a combined emitting point, the intensity and color shift characteristics of the display substrate at large perspective view angles can be improved over using pixel of single-thickness ITO.

TABLE 3

|  | Angles | CIEx | CIEy | Δu'Δv' |
|---|---|---|---|---|
| 6 nm + 20 nm Mixed pixel | 0 | 0.2633 | 0.7 | 0 |
|  | 60 | 0.2597 | 0.6903 | 0.00226 |
| 6 nm | 0 | 0.219182 | 0.79408 | 0 |
|  | 60 | 0.233028 | 0.679118 | 0.009207 |
| 14 nm | 0 | 0.253429 | 0.700664 | 0 |
|  | 60 | 0.236162 | 0.67489 | 0.008 |
| 20 nm | 0 | 0.286923 | 0.681878 | 0 |
|  | 60 | 0.242073 | 0.675238 | 0.018083 |

As seen from the data shown in Table 3, the color shift of the mixed pixel is reduced, indicating that using mixed pixel with different microcavities with different optical lengths in OLED devices of adjacent pixels can improve intensity and color shift characteristics at various perspective view angles of the display substrate.

Optionally, to adjust optical length of different microcavities in the OLED devices of same color in adjacent pixels can be executed according to one of the embodiments described herein to adjust just thickness of only one type of layer within the microcavity while keeping thicknesses of other layers unchanged. Optionally, to adjust optical length of different microcavities in the OLED devices can be executed also by combining two adjustments respectively for two types of layers within the microcavity while keeping other type of layers unadjusted. Optionally, to adjust optical length of different microcavities in the OLED devices can be executed also by combining three adjustments respectively for three types of layers within the microcavity while retaining thickness for other layers.

The display substrate of the present embodiment is configured to make a sub-pixel of a certain color to be combined by two OLED devices of the same color having different microcavities with different optical lengths. This is achieved by changing thickness of corresponding transparent electrode layer to obtain different optical length of the microcavity structure. A lithography technique is used to form the transparent electrode layer to ensure high resolution of the display substrate. The perspective view characteristics of the display substrate of the embodiment have been substantially improved at the condition of preserving high resolution for image display.

Referring to the embodiments described above, the OLED devices of a same color in adjacent pixels have different microcavities with different optical lengths. Referring to the embodiment shown in FIG. 7, additionally, the OLED devices of different colors in a same pixel can be formed with different transparent electrode layers with different thicknesses. Based on these disclosures, the display substrate of the present embodiment is configured such that at least one OLED device of any color in one pixel can include more than one microcavities of different optical lengths. The display substrate of the present embodiment is also capable of improving intensity and color shift characteristics thereof at various perspective view angles.

In an OLED device of any one color in a pixel, the first electrode of the OLED device also includes a transparent electrode layer and a optical functional layer (such as a hole transporting layer). At least one of the transparent electrode layer, the emitting layer, and the optical functional layer (hole transporting layer) is set with different thickness. In other words, in an OLED device of a certain color in a particular pixel, any one or two or all three of the transparent electrode layer, the emitting layer, and the optical functional layer (hole transporting layer) can be set with different thicknesses within the range of the pixel. Therefore, this single OLED device of any color, red, green, or blue, can have different microcavities of different optical lengths (e.g., two different thicknesses), thereby facilitating the adjustment and improvement of emitting intensity and color shift characteristics at various perspective view angles.

Optionally, in the present embodiment, the OLED devices of the same color in different pixels can be configured to have the same microcavity. Thus, multiple OLED devices of the same color in multiple different pixels can have the same microcavity repeated so as to simplify the manufacture process.

Figure 9:
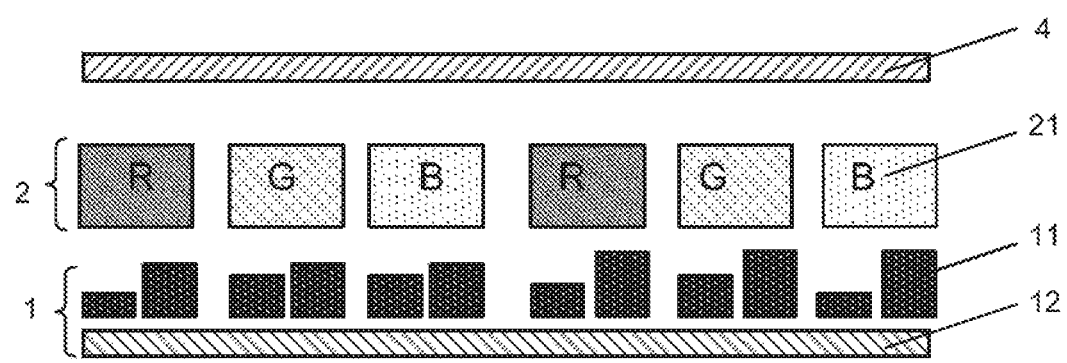
FIG. 9 is a schematic structural diagram of an organic light emitting diode device in a display substrate according to an alternative embodiment of the present disclosure.

FIG. 9 is a schematic structural diagram of an organic light emitting diode device in a display substrate according to some embodiments of the present disclosure. This is an example showing that the transparent electrode layer of an OLED device of a single color in a pixel has at least two microcavities with different thicknesses. Referring to FIG. 9, the transparent electrode layer 11 in the OLED device of each single color has two different thicknesses. In other words, two microcavities with different optical length are formed within this OLED device. Optionally, as the transparent electrode layer 11 has different thicknesses, different portions of the transparent electrode layer 11 with different thicknesses are disposed separately in the OLED device. Transparent electrode layers 11 with different thicknesses are not in contact to each other so that tip discharge effect is avoided to ensure stable performance of the OLED device.

For forming the OLED device of the present disclosure, since at least one OLED device of any one color in one pixel can have different microcavities with different optical lengths, the transparent electrode layer, the emitting layer, and the hole transporting layer of different thicknesses can be formed as repeating unit in different OLED devices of the same color in adjacent pixels. This approach can simplify the manufacture process.

Additionally, in the display substrate of the embodiment shown in FIG. 9, OLED devices of same color in adjacent pixels can be configured to have different microcavities with different optical lengths and at the same time at least one OLED device of any color in the pixel can be configured to have different microcavities with different optical lengths. Among all of the plurality of pixels in the display substrate, in a portion of pixel region OLED devices of same color in adjacent pixels can be configured to have different microcavities with different optical lengths. While in another portion of pixel region, at least one of all OLED devices of any single color in a same pixel can be configured to have different microcavities with different optical lengths. The arrangement of these different portions of pixel regions can be given based on specific applications for actual image display.

Optionally, in the OLED device according to all embodiments described herein, a caping layer (CPL) can be disposed at an exit side of the OLED to ensure a better display effect.

The display substrate of the present embodiment is applicable for improving microcavity structure of a top-emission type OLED device. Alternatively, the embodiment also can be applied to separately adjust color shift of a single color OLED device in any sub-pixel of any pixel to reduce color shift of white light and applied to adjust color gamut of a display apparatus having the same display substrate.

In another aspect, the present disclosure provides a display apparatus including a display substrate configured according to any one of embodiments described herein. The display apparatus can be any one of electronic paper, smart phone, tablet computer, television, displayer, notebook computer, digital image frame, navigator, or any products or components that have function of display.

The display apparatus provided in the present disclosure has many advantages in emitting intensity and color shift characteristics for various perspective view angles associated with the improved display substrate described herein over conventional display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate comprising an array of matrix of a plurality of pixels, a respective one of the plurality of pixels comprising several organic light emitting diode (OLED) devices emitting light of different color, a respective OLED device including at least a first electrode having a reflective surface, an emitting layer, and a second electrode having a transflective surface, wherein the respective OLED device comprises a microcavity characterized by an optical length based on a physical distance between the reflective surface and the transflective surface;

wherein OLED devices emitting light of same color respectively from the plurality of pixels have at least two microcavities with different optical lengths;

wherein the respective OLED device further comprises an optical functional layer including at least one of a hole transporting layer, an electron transporting layer, a hole injection layer and an electron injection layer between the first electrode and the second electrode;

wherein the first electrode includes at least a transparent electrode layer;

wherein at least one of the transparent electrode layer, at least one of the optical functional layer, and the emitting layer of the respective OLED device is adjusted with a different thickness to provide different microcavities for two OLED devices emitting light of same color in two adjacent pixels of the plurality of pixels;

wherein transparent electrode layers of two OLED devices emitting light of same color in two adjacent pixels of the plurality of pixels have different thicknesses.

2. The display substrate of claim 1, wherein OLED devices emitting light of same color in two adjacent pixels have different microcavities with different optical length and OLED devices in a same pixel have a same microcavity with a same optical length.

3. The display substrate of claim 1, wherein the OLED devices emitting light of same color in two adjacent pixels have different microcavities with different optical length and at least one of OLED devices in a same pixel has a different microcavity with a different optical length.

4. The display substrate of claim 1, wherein the OLED devices emitting light of same color in two adjacent pixels have different microcavities with different optical length and each OLED device has at least two microcavities with different optical length.

5. The display substrate of claim 1, wherein thicknesses of transparent electrode layers vary periodically from one pixel to next adjacent pixel.

6. The display substrate of claim 1, wherein thicknesses of transparent electrode layers vary with a ladder distribution over one or more pairs of adjacent pixels of the plurality of pixels.

7. The display substrate of claim 6, wherein the ladder distribution comprises a step size ranging from 1 nm to 8 nm.

8. The display substrate of claim 1, wherein the first electrode further comprises a reflective electrode layer laminated with the transparent electrode layer at a side more distal to the emitting layer.

9. The display substrate of claim 8, wherein the transparent electrode layer comprises at least one material selected from indium gallium oxide, indium zinc oxide, indium tin oxide, and indium gallium tin oxide; the reflective electrode layer comprises at least one material selected from silver, magnesium, and aluminum; the second electrode comprises at least one material selected from silver, magnesium, and aluminum.

10. The display substrate of claim 1, wherein optical functional layers of two OLED devices emitting light of same color respectively in any two adjacent pixels have different thicknesses.

11. The display substrate of claim 10, wherein thicknesses of optical functional layers vary periodically from one pixel to next adjacent pixel.

12. The display substrate of claim 10, wherein thicknesses of optical functional layers vary with a ladder distribution over one or more pairs of adjacent pixels of the plurality of pixels.

13. The display substrate of claim 12, wherein the ladder distribution comprises a step size ranging from 1 nm to 8 nm.

14. The display substrate of claim 1,
wherein emitting layers of two OLED devices emitting light of same color respectively in two adjacent pixels have different thicknesses.

15. The display substrate of claim 14, wherein thicknesses of emitting layers vary periodically from one pixel to next adjacent pixel.

16. The display substrate of claim 14, wherein thicknesses of emitting layers vary with a ladder distribution over one or more pairs of adjacent pixels of the plurality of pixels.

17. A display apparatus comprising a display substrate of claim 1.

18. A display substrate comprising an array of matrix of a plurality of pixels, a respective one of the plurality of pixels comprising several organic light emitting diode (OLED) devices emitting light of different color, a respective OLED device including at least a first electrode having a reflective surface, an emitting layer, and a second electrode having a transflective surface, wherein the respective OLED device comprises a microcavity characterized by an optical length based on a physical distance between the reflective surface and the transflective surface;
- wherein OLED devices emitting light of same color respectively from the plurality of pixels have at least two microcavities with different optical lengths;
- wherein the respective OLED device further comprises an optical functional layer including at least one of a hole transporting layer, an electron transporting layer, a hole injection layer and an electron injection layer between the first electrode and the second electrode;
- wherein the first electrode includes at least a transparent electrode layer;
- wherein at least one of the transparent electrode layer, at least one of the optical functional layer, and the emitting layer of the respective OLED device is adjusted with a different thickness to provide different microcavities for two OLED devices emitting light of same color in two adjacent pixels of the plurality of pixels;
- wherein the transparent electrode layer for the respective OLED device comprises portions with different thicknesses; and
- the portions with different thicknesses are disposed separately from each other in the respective OLED device.

* * * * *